(12) United States Patent
Diglio et al.

(10) Patent No.: US 9,791,501 B2
(45) Date of Patent: Oct. 17, 2017

(54) COMPLIANT THERMAL CONTACT DEVICE AND METHOD

(71) Applicant: Intel Corporation, Santa Clara, CA (US)

(72) Inventors: Paul Diglio, Chandler, AZ (US); David W. Song, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 803 days.

(21) Appl. No.: 13/625,334

(22) Filed: Sep. 24, 2012

(65) Prior Publication Data
US 2014/0084953 A1    Mar. 27, 2014

(51) Int. Cl.
*G01R 31/10* (2006.01)
*G01R 31/28* (2006.01)
*F28F 13/00* (2006.01)

(52) U.S. Cl.
CPC ..... *G01R 31/2875* (2013.01); *G01R 31/2863* (2013.01); *F28F 2013/005* (2013.01)

(58) Field of Classification Search
CPC .................. G01R 31/2863; G01R 31/2875
USPC ............... 324/750.05–750.07, 750.09, 750.1
See application file for complete search history.

(56) References Cited

U.S. PATENT DOCUMENTS

| | | | | |
|---|---|---|---|---|
| 5,129,448 A | * | 7/1992 | Holmberg et al. | 165/86 |
| 5,133,403 A | * | 7/1992 | Yokono et al. | 165/185 |
| 5,172,049 A | * | 12/1992 | Kiyokawa | G01R 31/2851 219/209 |
| 5,515,912 A | * | 5/1996 | Daikoku et al. | 165/80.4 |
| 6,147,506 A | * | 11/2000 | Ahmad | G01R 31/2851 324/750.05 |
| 6,910,271 B2 | * | 6/2005 | Peterson et al. | 29/890.03 |
| 2003/0060996 A1 | * | 3/2003 | Yi | G01R 31/31724 702/121 |
| 2006/0220667 A1 | * | 10/2006 | Tashiro et al. | 324/763 |
| 2008/0084668 A1 | * | 4/2008 | Campbell et al. | 361/702 |
| 2010/0040107 A1 | * | 2/2010 | Nakamura | G01R 31/2874 374/57 |
| 2011/0318974 A1 | * | 12/2011 | Timsit | 439/816 |
| 2013/0050878 A1 | * | 2/2013 | Perez | H01G 2/14 361/15 |

* cited by examiner

*Primary Examiner* — Patrick Assouad
*Assistant Examiner* — Demetrius Pretlow
(74) *Attorney, Agent, or Firm* — Schwegman Lundberg & Woessner, P.A.

(57) ABSTRACT

Examples of thermal contact devices and methods are shown. Compliant thermal contact devices are shown that include interleaved conducting structures to provide a high thermal conduction contact area. Selected examples include a thermal interface material located at the interleaved interface between the conducting structures. Selected examples also include designs for alternate chip orientations.

15 Claims, 7 Drawing Sheets

COMPLIANT THERMAL CONTACT DEVICE AND METHOD

TECHNICAL FIELD

Embodiments pertain to integrated circuit (IC) dies, die packages, associated die testing equipment, and associated methods.

BACKGROUND

Semiconductor devices frequently include more than one chip on a substrate. The chips in these devices are often tested at elevated temperature to test one or more metrics such as performance at elevated temperature, stress to failure, etc. One issue with multiple chips on a substrate in a single device includes variation in chip height over the substrate. Test fixtures for conducting heat to individual chips on the substrate function by conducting heat through direct contact with the chip. When chip heights vary, it can be difficult to make direct contact with each chip on the semiconductor device.

Test fixtures and fixture components are desired to improve the ability to test multiple components, such as chips, in a device at elevated temperatures.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
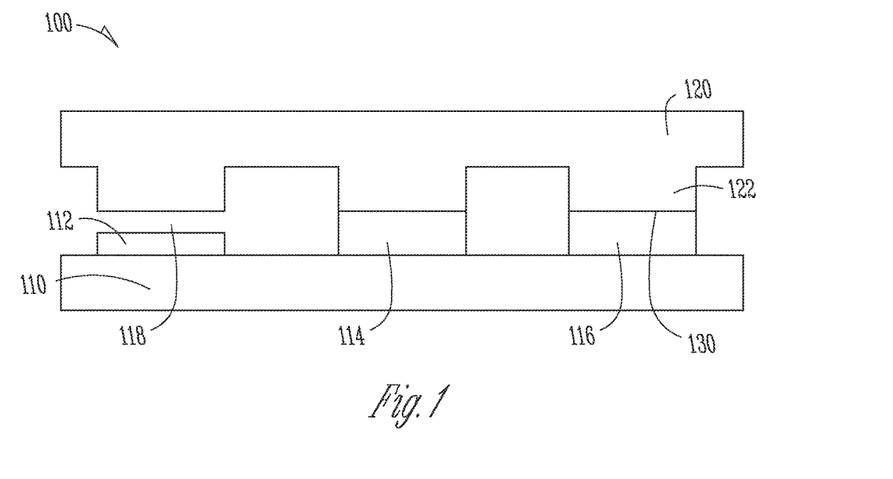
FIG. 1 is a thermal testing device in use in accordance with some embodiments.

FIG. 1 shows a thermal test fixture 100 in use according to one example. The thermal test fixture 100 includes a test fixture base 120 having a plurality of semiconductor chip thermal test fixtures 122 coupled to the test fixture base 120. A semiconductor device 110 is shown in a thermal test procedure. The semiconductor device 110 includes a first chip 112, a second chip 114, and a third chip 116. The first chip 112 is shown with a gap 118 between the semiconductor chip 112 and a corresponding thermal test fixture 122. The second chip 114 and third chip 116 make contact with the thermal test fixtures 122 to form an interface 130.

In one example, as illustrated in FIG. 1, where three chips are positioned in a substantially straight line, it is difficult to make thermal contact with all chips at the same time, due to differences in chip height. Although three chips in a straight line are shown as an example, other configurations of devices having alternative arrangements of multiple chips are also within the scope of the invention. For example four chips arranged at corners of a square or rectangle will benefit from embodiments of the present invention. Further, although semiconductor chips are described in the example, other device components may be tested using devices and methods described in the present disclosure.

Figure 2:
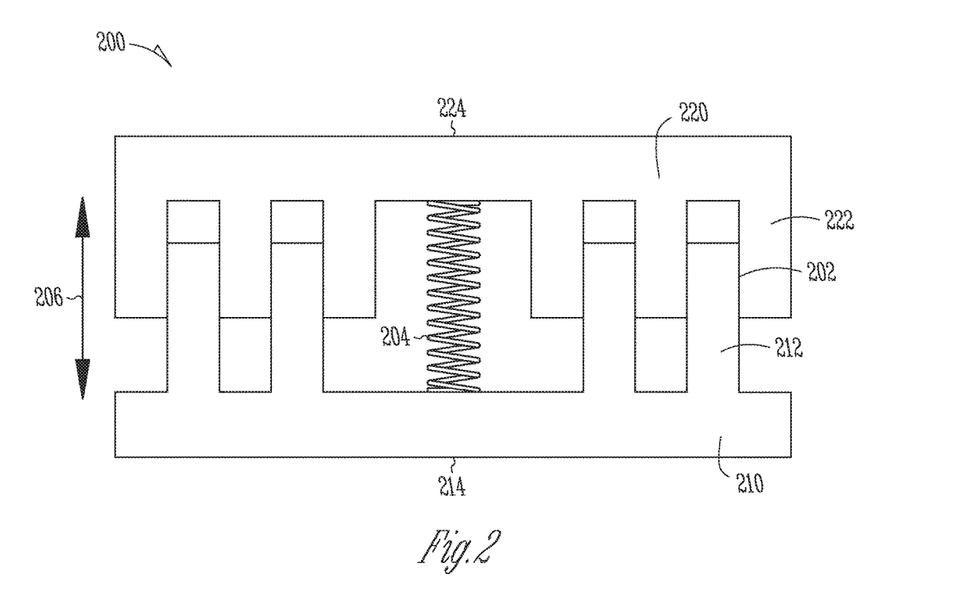
FIG. 2 is a cross section diagram of a thermal contact device in use in accordance with some embodiments.

FIG. 2 shows a thermal contact device 200 according to an example of the invention. The thermal contact device 200 includes a thermally conducting device contact pad 210 and a heat distributing pad 220. The device contact pad 210 includes a first number of conducting structures 212 protruding from the device contact pad 210. The heat distributing pad 220 includes a second number of conducting structures 222 protruding from the heat distributing pad 220. The device contact pad 210 and the heat distributing pad 220 are movable in sliding contact with respect to one another in a range of motion, indicated by arrow 206.

In one example the first number of conducting structures 212 and the second number of conducting structures 222 are interleaved with one another, creating an interface region 202. By interleaving the first number of conducting structures 212 and the second number of conducting structures 222, a large interface region 202 is provided, with high thermal conduction, due to the surface area of the interface region 202. An interleaved configuration allows the range of motion 206, while maintaining the large contact area at the interface 202. This configuration provides both compliance (e.g. motion within the range of motion 206) and high thermal conductivity. This configuration also provides reliability and repeatability for the thermal contact device 200. In one example, thermal contact devices described in the present disclosure are reliable and repeatable after hundreds of thousands of cycles. In contrast, other possible compliant contact configurations, such as an elastomeric interface material, may need to be serviced at a higher frequency.

In one example, the first number of conducting structures 212 and the second number of conducting structures 222 include thermal conducting fins, although the invention is not so limited. Other examples may include interleaved posts, or complex shapes. The thermal conducting structures may include any structure that provides a high contact area at an interface, such as interface 202, and provides a range of motion. As will be shown in selected examples below, fins may include ring like structures, flat structures, etc. In one example, only one side of the device 200 (either the device contact pad 210 or the heat distributing pad 220) includes fins, while the other side includes a structure configured to mate with the fins.

In one example, a thermal interface material is included at the interface 202 between the first number of conducting structures 212 and the second number of conducting structures 222. In one example, the thermal interface material includes a thermally conducting grease. In selected examples, heat conducting particles, such as metal particles, may be included in a thermal grease to improve thermal conductivity. Other examples of thermal interface materials include viscous fluids such as oils or polymers, each or which may include suspended heat conducting particles.

A biasing device 204 is further shown in FIG. 2, to provide a contact pad pressure during use of the device 200. In one example, the biasing device 204 includes a metallic spring, such as a steel coil spring. In one example one or more Belleville washers are used as a biasing device 204. Belleville washers in particular provide a reliable spring force over small displacement distances in the range of motion 206.

Figure 3A:
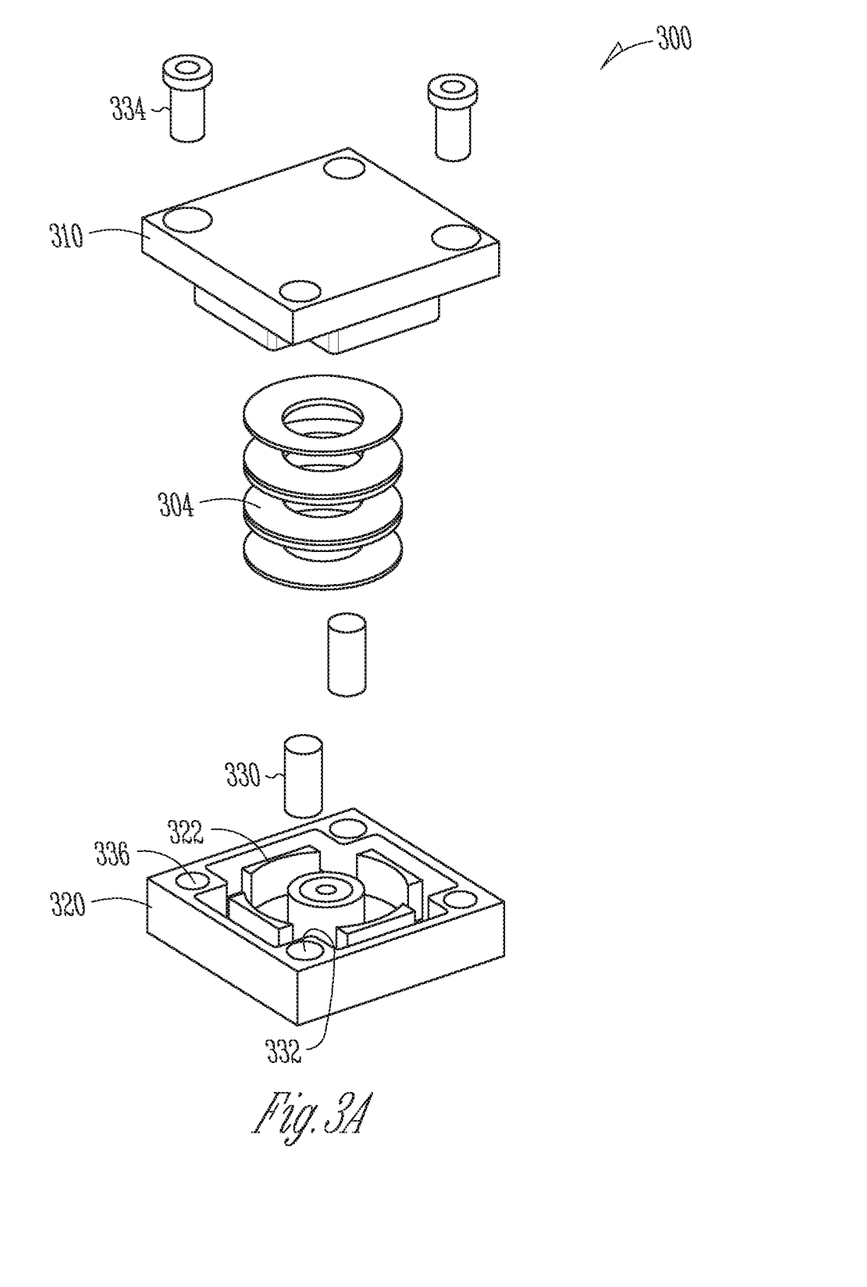
FIG. 3A is an exploded perspective view of a thermal contact device in accordance with some embodiments.
Figure 3B:
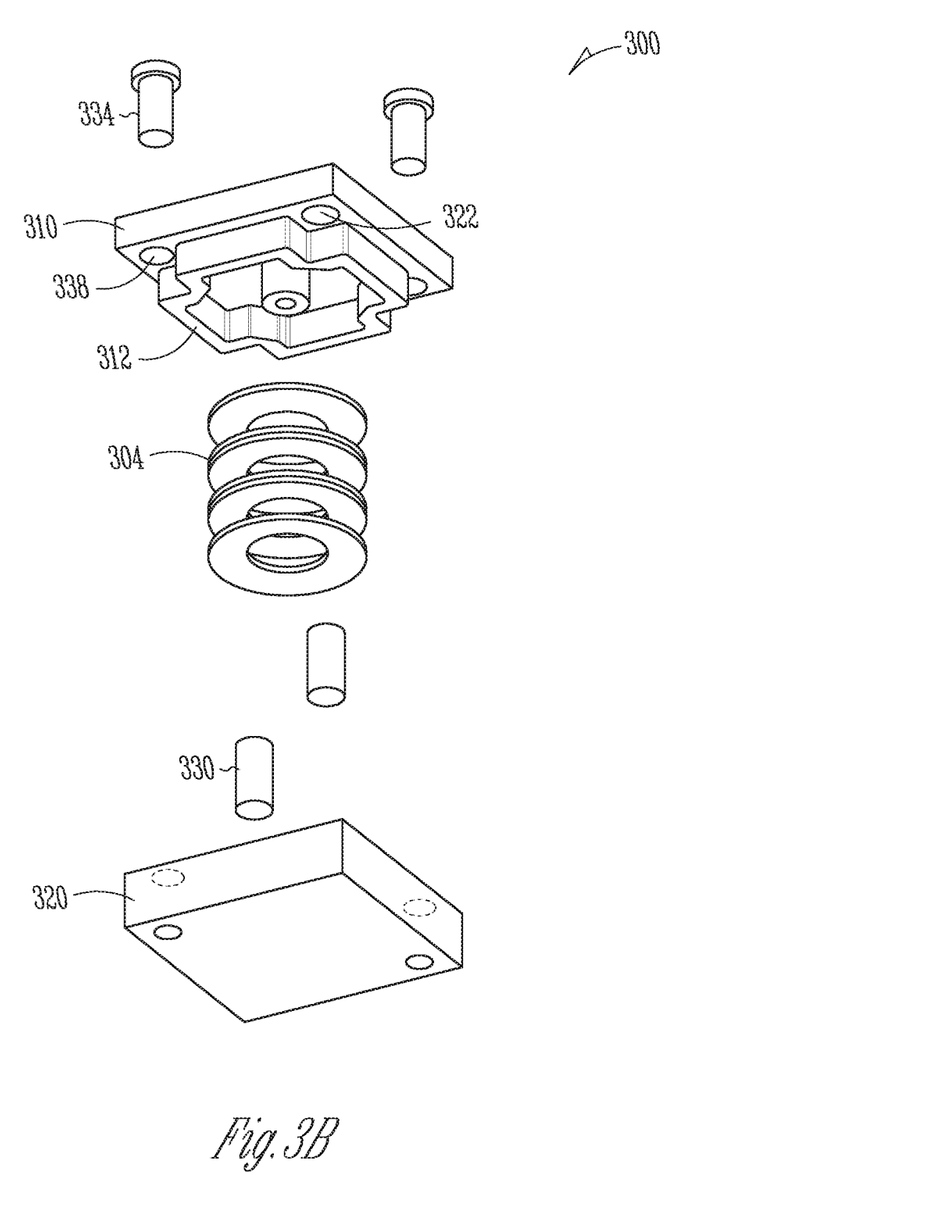
FIG. 3B is an exploded perspective view of the thermal contact device from FIG. 3A in accordance with some embodiments.

FIGS. 3A and 3B show another example of a thermal contact device 300 according to an embodiment of the invention. The thermal contact device 300 includes a thermally conducting device contact pad 310 and a heat distributing pad 320. The device contact pad 310 includes a first number of conducting structures 312 protruding from the device contact pad 310. The heat distributing pad 320 includes a second number of conducting structures 322 protruding from the heat distributing pad 320.

A stack of Belleville washers 304 are shown as a biasing device to provide a contact pad pressure when in use. A number of guide pins 330 are also included in the device 300, along with mating hoes 332. In one example, the guide pins 330 and mating holes 332 provide precise alignment and controlled motion between the conducting device contact pad 310 and the heat distributing pad 320. In the example shown, fasteners 334, such as threaded bolts and mating holes 336 are used to hold the device contact pad 310 and the heat distributing pad 320 together, while still maintaining a range of motion, similar to the range of motion 206 described in FIG. 2.

Figure 4:
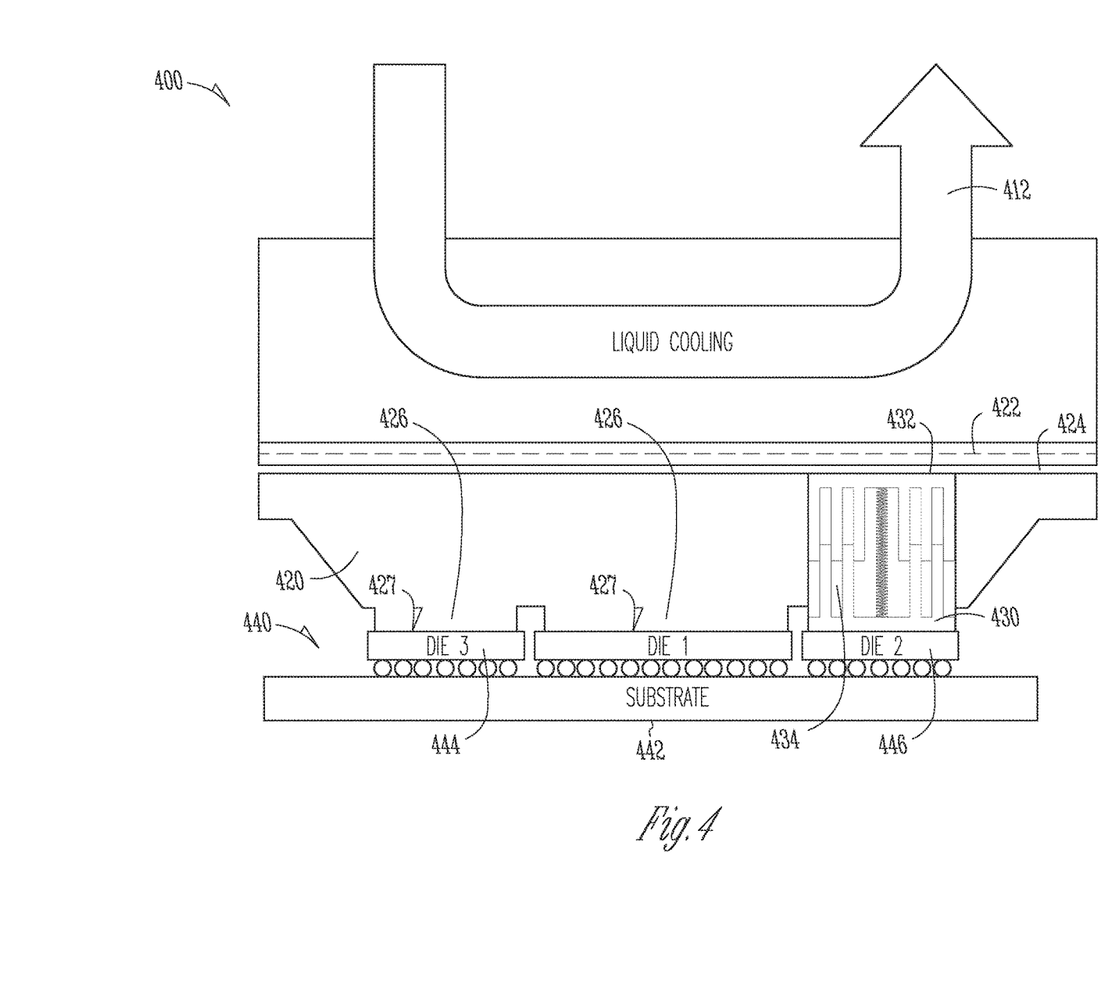
FIG. 4 is a thermal testing device in use in accordance with some embodiments.

FIG. 4 shows a thermal testing device 400 according to an embodiment of the invention. A test fixture base 420 is shown coupled to a heater 422 such as a resistive heater. In one example a thermal interface material 424, such as a thermal grease is included to improve heat transmission into the test fixture base 420. A cooling device 412, such as liquid cooling pathway shown in FIG. 4, is included to further control a temperature in the test fixture base 420. In operation, either the heater 422, or the cooling device 412 may be cycled on for a given amount of time to precisely control a temperature at the device being tested. In selected examples, heat may also be generated by chips being tested. In one example the thermal testing device 400 is used to precisely control chip temperatures, in contrast to heat spikes and cool periods that may be present under normal chip operating conditions.

A semiconductor device 440 is shown in place during a thermal testing operation. The semiconductor device 440 includes a number of chips 444 coupled to a substrate 442. Two of the chips 444 are located under a fixed portion of a test fixture base 420. In the example shown, the fixed portion of the test fixture base 420 includes a plurality of thermal test fixtures 426. The thermal test fixtures 426 can each include a device contact pad 427. A third selected chip 446 is shown located under a compliant thermal contact device 430. The compliant thermal contact device 430 includes a number of interleaved conducting structures 434 similar to interleaved conducting structures described in embodiments above. In one example a thermal interface material 432 is shown between the compliant thermal contact device 430 and the heater 422.

In operation, a fixed portion of a thermal contact device 420 will make contact with any two chips with some degree of success, because two points determine a line. If an additional chip or chips are added to the device 440 being tested (for example, along a same line), due to manufacturing variances, the third chip 446 may not align with the other two chips 444. Using configurations described in the present disclosure, the compliant thermal contact device 430 will adjust to a height of the third chip 446 and as a result, contact with the thermal test fixture to all the semiconductor chips on the semiconductor device will be made at the same time. As noted above, although examples described illustrate three chips in a line, embodiments of the invention also encompass testing of devices with multiple chips that are not arranged in a linear configuration.

Figure 5A:
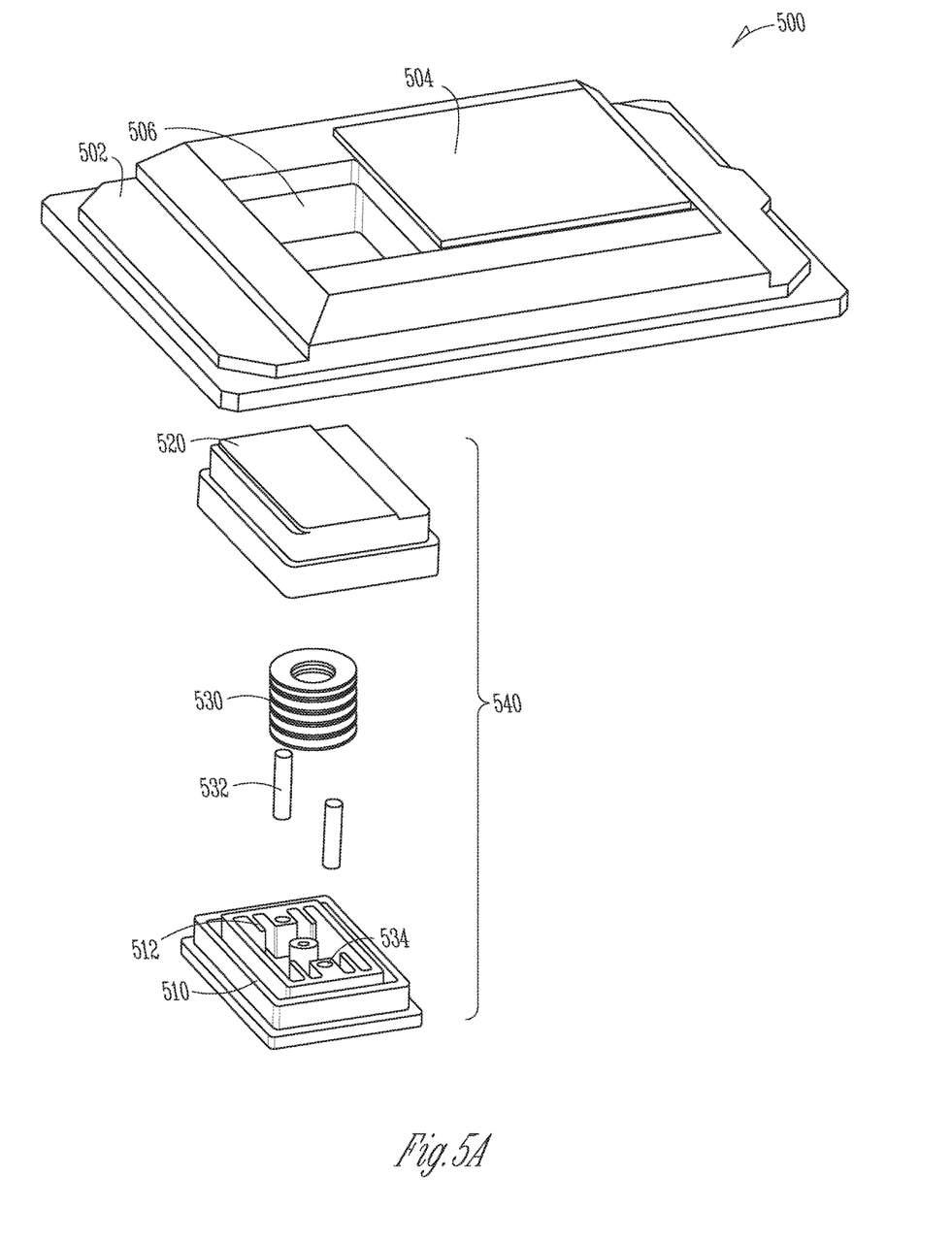
FIG. 5A is an exploded perspective view of a thermal testing device in accordance with some embodiments.
Figure 5B:
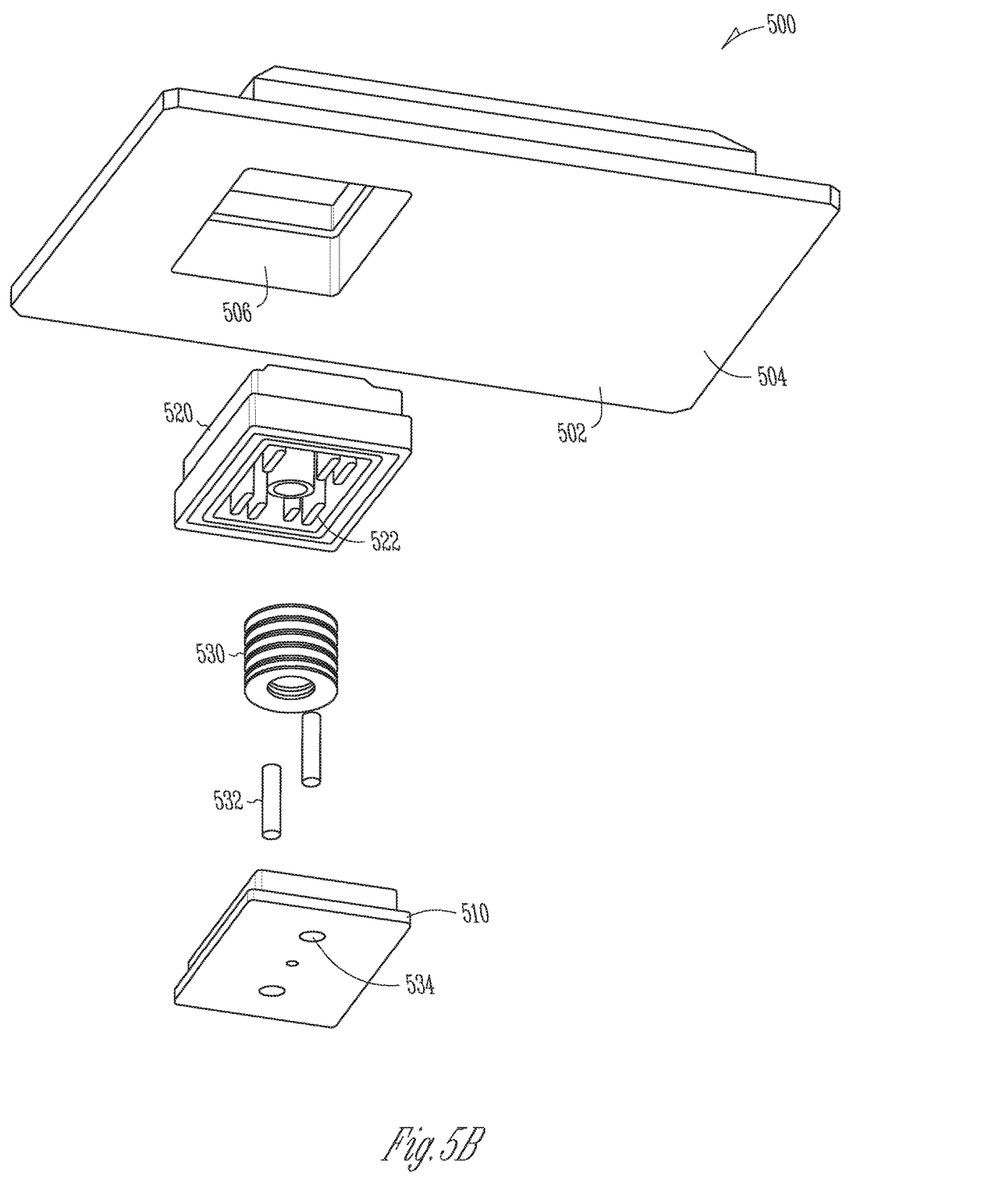
FIG. 5B is an exploded perspective view of the thermal testing device from FIG. 5A in accordance with some embodiments.

FIGS. 5A and 5B illustrate another example of a thermal contact device 500 according to an embodiment of the invention. The thermal contact device 500 includes a test fixture base 502 with a fixed thermal test fixture region 504. In one example, the fixed thermal test fixture region 504 may be used to test two chips. The thermal contact device 500 further includes a compliant thermal contact device 540.

The compliant thermal contact device 540 includes a thermally conducting device contact pad 520 and a heat distributing pad 510. The device contact pad 520 includes a first number of conducting structures 522 protruding from the device contact pad 520. The heat distributing pad 510 includes a second number of conducting structures 512 protruding from the heat distributing pad 510. A stack of Belleville washers 530 are shown as a biasing device to provide a contact pad pressure when in use. A number of guide pins 532 are also included in the compliant thermal contact device 540, along with mating hoes 534.

FIGS. 5A and 5B show an example thermal contact device 500 where the compliant thermal contact device 540 may be added as a module. With a modular design, as shown in FIGS. 5A and 5B, the compliant thermal contact device 540 can be easily used to modify existing thermal contact devices and testing devices.

Figure 6:
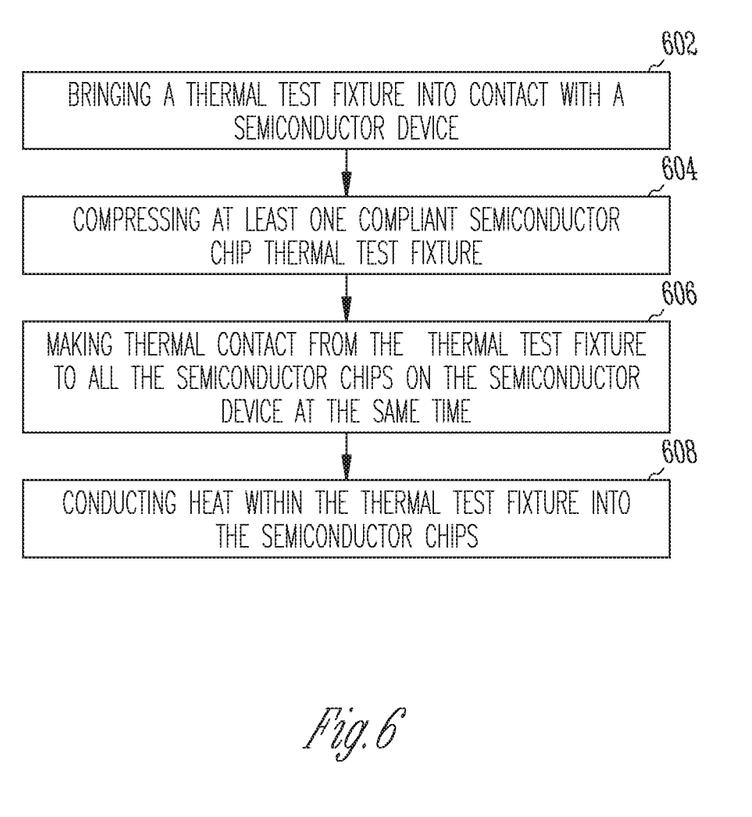
FIG. 6 is a flow diagram of a method in accordance with some embodiments.

FIG. 6 shows an example method of testing using thermal contact devices as described in examples above. In operation 602 a thermal test fixture is brought into contact with a semiconductor device, including three or more semiconductor chips. In operation 604 at least one compliant semiconductor chip thermal test fixture is compressed. The compression includes sliding a number of interleaved structures past one another within a range of motion. In operation 606, thermal contact is made from the thermal test fixture to all the semiconductor chips on the semiconductor device at the same time. In one example, thermal contact is made using the at least one compliant semiconductor chip thermal test fixture. Lastly, in operation 608, heat is conducted within the thermal test fixture into all the semiconductor chips on the semiconductor device to evaluate at least one metric under thermal stress. One example of a metric measured may include processor speed at a given temperature. Another example of a metric measured may include manufacturing yield of acceptable devices.

The above detailed description includes references to the accompanying drawings, which form a part of the detailed description. The drawings show, by way of illustration, specific embodiments in which the invention can be practiced. These embodiments are also referred to herein as "examples."Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A thermal contact device, comprising;
a first physically compliant thermally conducting device contact pad;
a first number of thermal conducting structures protruding from the device contact pad;
a heat distributing pad located adjacent to the device contact pad, and movable with respect to the device contact pad;
a second number of thermal conducting structures protruding from the heat distributing pad, wherein the first number of thermal conducting structures and the second number of thermal conducting structures are interleaved with one another;
two rigid thermally conducting device contact pads located adjacent to the first physically compliant thermally conducting device, wherein the first physically compliant thermally conducting device contact pad and the two rigid thermally conducting device contact pads are each configured to simultaneously be in communication with individual chips of a number of chips to be tested; and
a heat source separate from the number of chips to be tested, the heat source coupled to the heat distributing pad.

2. The thermal contact device of claim 1, further including a thermal interface material located at an interface between the first number of thermal conducting structures and the second number of thermal conducting structures.

3. The thermal contact device of claim 2, wherein the thermal interface material includes a heat conducting grease.

4. The thermal contact device of claim 1, wherein the first and second number of thermal conducting structures include fins.

5. The thermal contact device of claim 1, further including a biasing device to provide a contact pad pressure.

6. The thermal contact device of claim 5, wherein the biasing device includes a metallic spring.

7. The thermal contact device of claim 5, wherein the biasing device includes one or more Belleville washers.

8. The thermal contact device of claim 1, further including one or more guide pins coupled between the device contact pad and the heat distributing pad.

9. A thermal testing device, comprising;
a test fixture base;
a plurality of semiconductor chip thermal test fixtures coupled to the test fixture base, wherein at least one semiconductor chip thermal test fixture is a physically compliant semiconductor chip thermal test fixture capable of moving independently from other fixed thermal test fixtures in the plurality, and at least one other semiconductor chip thermal test fixture is a rigid semiconductor chip thermal test fixture, the physically compliant semiconducting thermal test fixture including:
a thermally conducting device contact pad;
a first number of thermal conducting structures protruding from the device contact pad;
a heat distributing pad located adjacent to the device contact pad, and movable with respect to the device contact pad;
a second number of thermal conducting structures protruding from the heat distributing pad, wherein the first number of conducting structures and the second number of conducting structures are interleaved with one another,
a viscous thermal interface material in contact between the first number of thermal conducting structures and the second number of thermal conducting structures; and
a heat source separate from a number of chips to be tested, the heat source coupled to each heat distributing pad in the number of test fixtures; and
wherein the plurality of semiconductor chip thermal test fixtures are each configured to be in communication with individual chips of the number of chips to be tested.

10. The thermal testing device of claim 9, wherein the plurality of semiconductor chip thermal test fixtures includes two fixed semiconductor chip thermal test fixtures and one physically compliant semiconductor chip thermal test fixture.

11. The thermal testing device of claim 9, wherein the plurality of semiconductor chip thermal test fixtures are arranged in a substantially straight line.

12. The thermal testing device of claim 9, wherein the first and second number of thermal conducting structures include fins.

13. The thermal testing device of claim 9, further including a biasing device to provide a contact pad pressure.

14. The thermal testing device of claim 13, wherein the biasing device includes a metallic spring.

15. The thermal testing device of claim 13, wherein the biasing device includes one or more Belleville washers.

* * * * *

UNITED STATES PATENT AND TRADEMARK OFFICE
CERTIFICATE OF CORRECTION

Page 1 of 1

PATENT NO. : 9,791,501 B2
APPLICATION NO. : 13/625334
DATED : October 17, 2017
INVENTOR(S) : Diglio et al.

It is certified that error appears in the above-identified patent and that said Letters Patent is hereby corrected as shown below:

In the Claims

In Column 6, Line 41, in Claim 9, delete "another," and insert --another;-- therefor Signed and Sealed this
Fourteenth Day of April, 2020

Andrei Iancu
*Director of the United States Patent and Trademark Office*